(12) United States Patent
Shi et al.

(10) Patent No.: US 6,703,299 B2
(45) Date of Patent: Mar. 9, 2004

(54) UNDERFILL PROCESS FOR FLIP-CHIP DEVICE

(75) Inventors: Song-Hua Shi, Phoenix, AZ (US); Milan Djukic, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/032,115

(22) Filed: Dec. 21, 2001

(65) Prior Publication Data

US 2003/0116864 A1 Jun. 26, 2003

(51) Int. Cl.$^7$ ................................................ H01L 21/44
(52) U.S. Cl. .................. 438/612; 438/108; 438/118; 438/127
(58) Field of Search ................. 257/725–727, 257/778, 779, 287, 795; 438/106–108, 118, 127, 612

(56) References Cited

U.S. PATENT DOCUMENTS

| | | | | |
|---|---|---|---|---|
| 5,704,116 A | * | 1/1998 | Gamota et al. ............... 29/840 |
| 5,817,545 A | * | 10/1998 | Wang et al. ................. 438/127 |
| 5,953,814 A | * | 9/1999 | Sozansky et al. ........... 438/108 |
| 5,998,242 A | * | 12/1999 | Kirkpatrick et al. ........ 438/127 |
| 6,000,924 A | * | 12/1999 | Wang et al. ................. 425/125 |
| 6,094,354 A | * | 7/2000 | Nakajoh et al. ............. 257/787 |
| 6,107,123 A | * | 8/2000 | Distefano et al. ........... 438/125 |
| 6,168,972 B1 | * | 1/2001 | Wang et al. ................. 438/108 |
| 6,187,613 B1 | * | 2/2001 | Wu et al. .................... 438/108 |
| 6,207,475 B1 | * | 3/2001 | Lin et al. .................... 438/108 |
| 6,232,152 B1 | * | 5/2001 | DiStefano et al. ........... 438/124 |
| 6,326,555 B1 | * | 12/2001 | McCormack et al. ....... 174/255 |

* cited by examiner

Primary Examiner—Eddie Lee
Assistant Examiner—Quang Vu
(74) Attorney, Agent, or Firm—Schwegman, Lundberg, Woessner & Kluth, P.A.

(57) ABSTRACT

The present invention relates to a method of packaging a microelectronic device that, in one embodiment, uses a vacuum-assisted underfill process. One embodiment of the method uses a curing process with a tacky film disposed over the device to prevent wicking of the underfill material after the underfill material is in place. One embodiment of the method uses a curing process that utilizes a non-tacky tacky film with a curing process to prevent wicking of the underfill material after the underfill material is in place.

16 Claims, 5 Drawing Sheets

UNDERFILL PROCESS FOR FLIP-CHIP DEVICE

BACKGROUND OF THE INVENTION

1. Field of the Invention

The present invention relates to microelectronic device packaging. More particularly, the present invention relates to underfill packaging of a flip-chip package. In particular, the present invention relates to a vacuum-assisted underfill process.

2. Description of Related Art

As the process of miniaturization progresses, chip packaging is also required to be miniaturized. This requirement has resulted in chip-scale packaging, wherein the ultimate goal is to have the chip and the chip package be virtually the same size.

A chip package usually includes a mounting substrate and a semiconductor chip or die that is located on or in the mounting substrate. One class of chip packaging includes semiconductor chips that are produced with C4 (controlled collapse chip connect) solder connections, on an active surface thereof, for purposes of electrically contacting the integrated circuit on the active surface of the chip to contact pads on the mounting substrate. The term active surface of a semiconductor chip or die, as used herein, means the surface of the chip or die which carries integrated circuitry. The term back surface, as used herein, means a side of the semiconductor chip or die that is opposite and parallel planar with the active surface.

During chip packaging, an epoxy is introduced under capillary action into a space between the die and the mounting substrate and is cured thereafter. The epoxy acts to bond the die to the mounting substrate and to protect the C4 solder connections during the temperature cycling it will experience during the product's lifetime.

As depicted in FIG. 1A and FIG. 1B, a chip package 10 includes a die 12, a mounting substrate 14, an electrical connection 16 such as a C4 bump, and an underfill material 18 that has been inserted between the die 12 and the mounting substrate 14 by capillary action. FIG. 1A depicts a nonuniform profile 20 and 21 of the underfill material 18 including a fillet portion 22 and 23, and an interstitial portion 24 that is sandwiched between the die 12 and the mounting substrate 14. It is noted in FIG. 1B that there is a tongue 25 of epoxy underfill material 18 on one side thereof. Accordingly, the fillet portion 22 and 23 that is depicted at profiles 20 and 21 in FIG. 1A exhibits an asymmetrical footprint upon the mounting substrate 14 as depicted in FIG. 1B. Although this tongue 25 of epoxy underfill material 18 may be of no consequence in some prior art embodiments, the pressure to miniaturize and to get even tighter bump pitch and chip-to-package gap height causes the presence of the tongue 25 to be undesirable.

One possible solution that is used in production is depicted in FIG. 2A and FIG. 2B. Processing is accomplished by directing a mold press 26 against a die 12 and a mounting substrate 14. Between the mold press 26 and the die 12 and mounting substrate 14, an adhesion-resistant film 28 is placed that is stretched and held while an underfill material feed tube 30 and a vent or vacuum tube 32 are used to flow underfill material 18 between die 12 and mounting substrate 14. After the underfill material 18 has been properly flowed therebetween to form uniform fillet portions 22 and the interstitial portion 24, the adhesion resistant film 28 and the mold press 26 are removed as depicted in FIG. 2B. As the adhesion resistant film 28 and the mold press 26 are removed, some wicking action between the adhesion resistant film 28 and the underfill material 18 forms an uneven surface 34 (depicted in an arbitrary shape and surface roughness) that often must be smoothed after curing. Additionally, and more serious to process yield, some wick spillage 36 forms on the back surface 38 of die 12 that must be removed.

BRIEF DESCRIPTION OF THE DRAWINGS

In order that the manner in which embodiments of the present invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

An embodiment of the present invention relates to a chip packaging process. A semiconductor chip, a semiconductor package, a method of assembling a semiconductor package, and a method of producing a semiconductor chip are also described as embodiments. One embodiment relates to a method of forming a chip package that allows underfill material to be flowed to the chip assembly with no wick spillage onto the back side of the die.

The following description includes terms, such as upper, lower, first, second, etc. that are used for descriptive purposes only and are not to be construed as limiting. The embodiments of a device or article of the present invention described herein can be manufactured, used, or shipped in a number of positions and orientations. The term "substrate" generally refers to the physical object that is the basic workpiece that is transformed by various process operations into the desired article. A substrate may be made of silica glass or the like, or it may be made of plastic. A substrate may also be referred to as a wafer. Wafers may be made of semiconducting, non-semiconducting, or combinations of semiconducting and non-semiconducting materials.

Reference will now be made to the drawings wherein like structures will be provided with like reference designations. In order to show the structures of the present invention most clearly, the drawings included herein are diagrammatic representations of inventive articles. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1A:
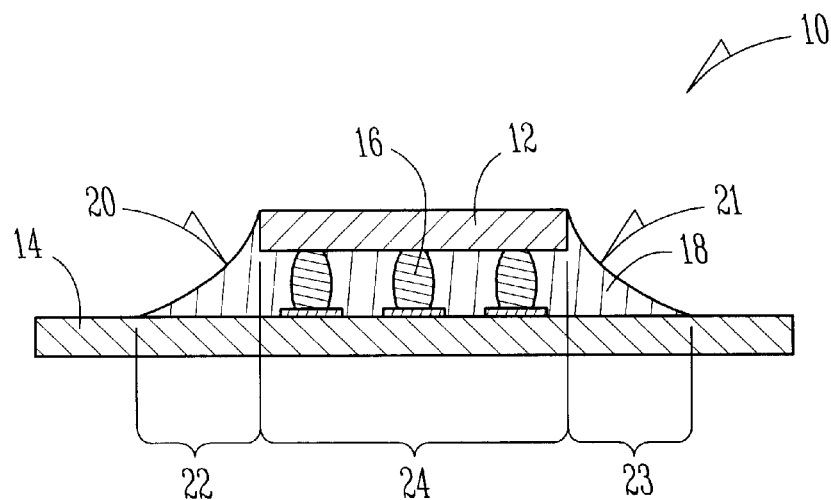
FIG. 1A is a cross section of a prior art chip package.
Figure 1B:
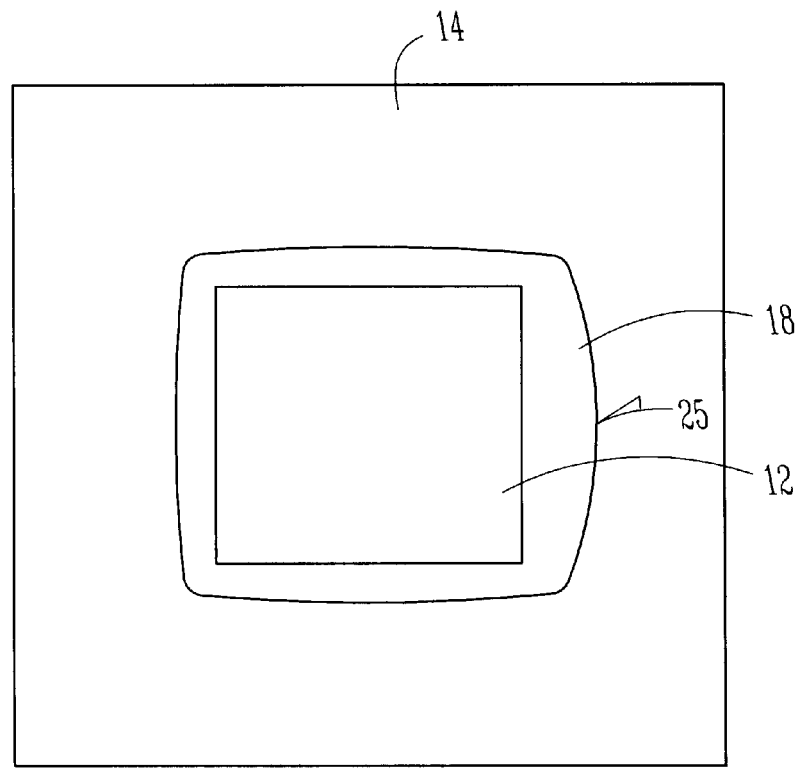
FIG. 1B is a top plan view of the chip package depicted in FIG. 1A.
Figure 2A:
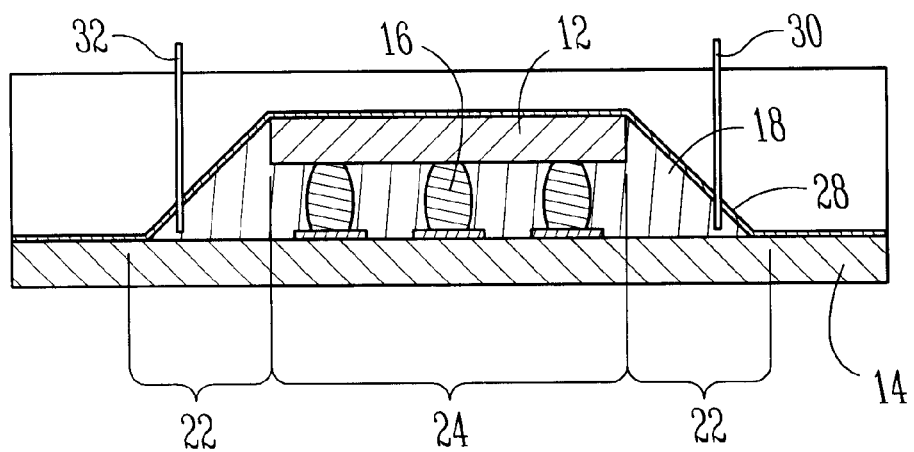
FIG. 2A is a cross section of a prior art chip package during processing.
Figure 2B:
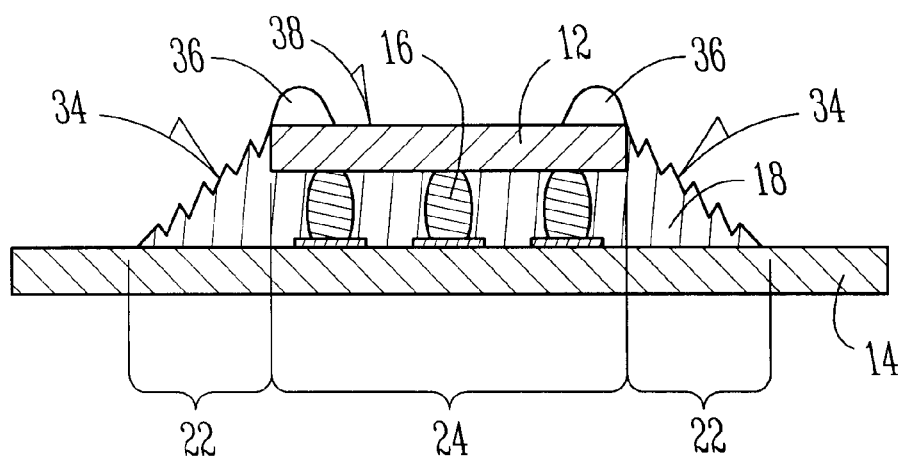
FIG. 2B is a cross section of the chip package depicted in FIG. 2 after further processing.
Figure 3A:
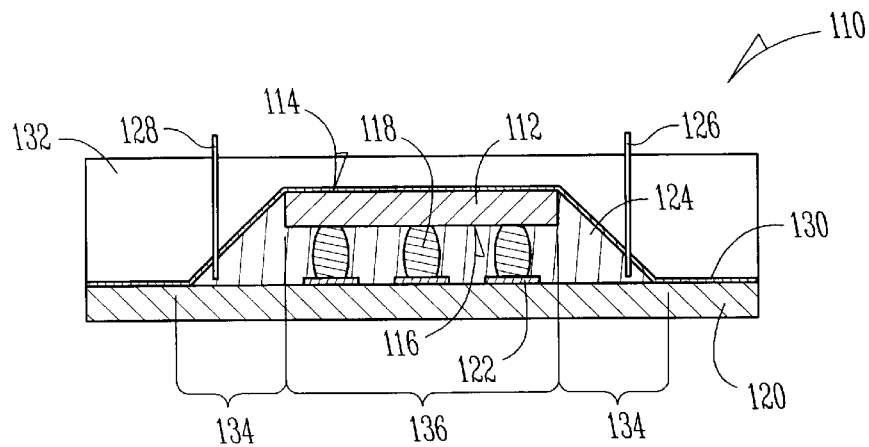
FIG. 3A is a cross section of a chip package during processing according to an embodiment.

FIG. 3A illustrates a process of underfilling a die according to an embodiment. In a cross-sectional view, FIG. 3A illustrates a flip-chip assembly 110 during underfill processing. The flip-chip assembly 110 includes a semiconductor die 112, according to one embodiment of the invention, that has a back surface 114 and an active surface 116. In one embodiment, the semiconductor die 112 is from about 4 mils thick to about 50 mils thick.

Upon the active surface 116, the semiconductor die 112 includes a plurality of C4 solder connections 118 thereon. The solder connections 118 may be substituted by solder columns, gold solder connections, or any other connecting structure that is capable of providing electrical interconnect between the semiconductor die 112 and a host device, such as a mounting substrate 120, motherboard, or the like. FIG. 3A also illustrates a plurality of electrical contact pads 122 thereon. The semiconductor die 112 is located on the mounting substrate 120 so that the C4 solder connections 118 on the active surface 116 of the semiconductor die 112 electrically contact the electrical contact pads 122.

Mechanical and electrical connection between the semiconductor die 112 and the mounting substrate 120 is achieved by passing the flip-chip assembly 110 through a reflow oven using a defined reflow profile for the selected solder material.

FIG. 3A also illustrates the presence of an underfill material 124 that has been applied in a space provided between the semiconductor die 112 and the mounting substrate 120. The underfill material 124 provides protection for the C4 solder connections 118 during temperature cycles. In one embodiment, the underfill material 124 is a substance which has a coefficient of thermal expansion which is similar to the coefficient of thermal expansion of the C4 solder connections 118. The underfill material 124 also acts to bond semiconductor die 112 to mounting substrate 120. In one embodiment, the underfill material 124 contains silicon dioxide particles in order to provide the underfill material 124 with a coefficient of thermal expansion which closely matches the coefficient of thermal expansion of the C4 solder connections 118. In one embodiment, the silicon dioxide particles are substantially spherical.

The underfill material 124 is introduced on a side of the semiconductor die 112 by a feed conduit 126 and a gas outlet conduit 128. The process of getting the underfill material 124 to flow into the space provided between the semiconductor die 112 and the mounting substrate 120 includes capillary action, pressure feeding through feed conduit 126, and pulling a vacuum through gas outlet conduit 128. It is noted that one, two, or three of these actions may be combined to get the underfill material 124 to properly flow. Underfill material that flows by any or all of these actions is known in the art.

In a general embodiment, the film 130 is depicted in FIG. 3A as having been stretched over the flip-chip assembly 110 and a mold press 132 is depicted as rendering a cross-sectional profile to film 130, and consequently to the underfill material 124. Of underfill material 124, it may be referred to as a fillet portion 134 and an interstitial portion 136 between the die 112 and the mounting substrate 120.

Figure 3B:
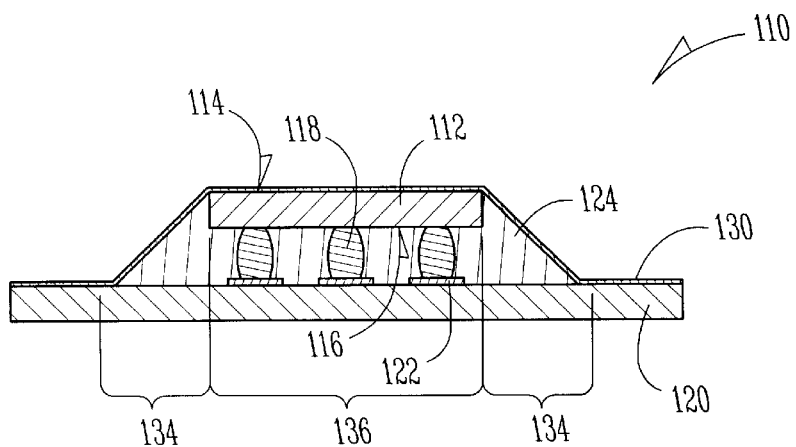
FIG. 3B is a cross section of the chip package depicted in FIG. 3A after further processing.

In a first specific embodiment class, a method of forming a package includes the use of a tacky film 130 that achieves a release under thermal processing conditions. The method includes placing the tacky film 130 against the flip-chip assembly 110, and particularly stretching it over the semiconductor die 112 and onto the mounting substrate 120. The form that the tacky film 130 takes is influenced by the shape of the mold press 132 that seals the tacky film 130 against the mounting substrate 120. After sealing the tacky film 130 against the mounting substrate 120, underfilling of the die is accomplished with the underfill material 124. Thereafter, the mold press 132 is withdrawn, and the tacky film 130 holds the underfill material in place and retains its cross-sectional profile imparted to it by the mold press 132 as depicted in FIG. 3B.

After removing the mold press 132, the flip-chip assembly 110 is placed in a heating environment to cure the underfill material 124. At some time after beginning the curing of the underfill material 124, the tacky film 130 releases due to the heat effect on the tacky substance, and the tacky film 130 is removed. Tacky film materials such as No. 3195VS film from Lockwood Industries, of Canoga Park, Calif., are currently used for heat-releasable applications and are known in the art.

Conditions that cause the tacky film 130 to release from the flip-chip assembly 110 depend upon the specific tacky film. Various curing schemes may be used. In one embodiment, a two-stage heat curing scheme is used. According to this embodiment, the method proceeds to a time after beginning curing the underfill material 124. Heating of the package is carried out in a curing oven under conditions to cause the tacky film 130 to release from the flip-chip assembly 110. This heating scheme includes a first temperature ramp from the ambient after underfilling, to a temperature range from about 100° C. to about 140° C. Next, a temperature hold is maintained at a temperature in this range. The temperature hold may be from about 10 seconds to about 30 minutes. The first temperature hold achieves an initial cure of the underfill material 124. Thereafter, a second temperature ramp is accomplished to get the tacky film 130 to release from the flip-chip assembly 110. The second temperature ramp is carried out to a temperature range from about 140° C. to about 260° C. After achieving a selected temperature in this range, it may be held from about 10 seconds to about 30 minutes. However, in one embodiment, no substantial hold time is required as the tacky film 130 releases upon achieving a selected tacky film 130 releasing temperature. Thereafter, ambient cooling of flip-chip assembly 110 may be done. Removal of the tacky film 130 may precede or follow the ambient cooling.

According to the first specific embodiment class, another embodiment uses a single temperature-ramp curing scheme. In this embodiment, a linear continuous curing oven is set to a selected temperature and flip-chip assembly 110 heats to desired temperatures as it passes through the oven. In one embodiment, the temperature ramp begins at the post-underfill ambient, and ends in a range from about 140° C. to about 240° C. The oven time ranges from about 10 seconds to about 90 minutes. Thereafter, ambient cooling of flip-chip assembly 110 may be done. Removal of the tacky film 130 may precede or follow the ambient cooling.

Figure 3C:
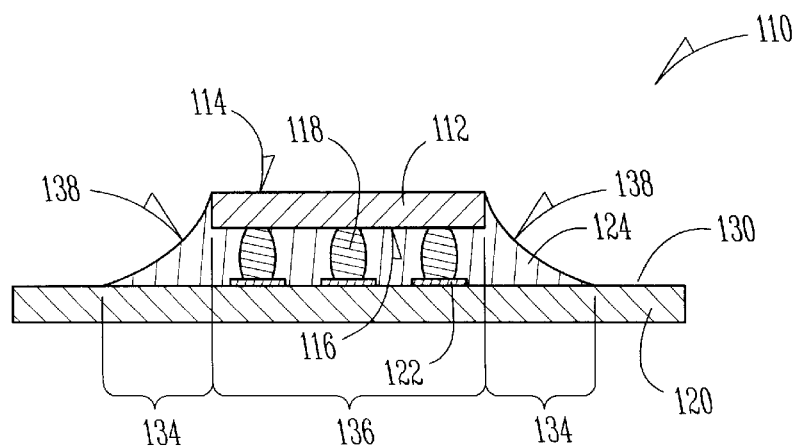
FIG. 3C is a cross section of the chip package depicted in FIG. 3A after further processing.

As depicted in FIG. 3C, flip-chip assembly 110 has been heat cured according to an embodiment. It is noted that the cured underfill material 124 includes the fillet portion 134 and the interstitial portion 136 that is between the die 112 and the mounting substrate 120. It is further noted that the fillet portion 134 includes a surface roughness 138 and pattern that is characteristic of the surface roughness and pattern that was impressed into the fillet portion 134 by the tacky film 130. Further, it is noted that the wherein the fillet portion 134 exhibits a concave curvilinear cross-sectional profile along its surface roughness 138. This optional concave curvilinear cross-sectional profile is caused by contraction of the underfill material 124 during the curing process according to an embodiment.

Figure 4A:
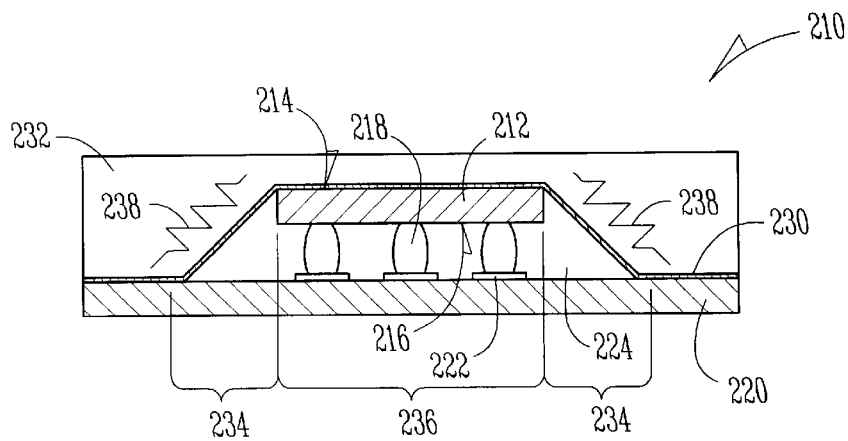
FIG. 4A is a cross section of a chip package during processing according to an embodiment.

In a second specific method embodiment class, a non-tacky film is used as depicted in FIG. 4A. In a cross-sectional view, FIG. 4A illustrates a flip-chip assembly 210 during underfill processing. The flip-chip assembly 210 includes a semiconductor die 212, according to one embodiment of the invention, that has a back surface 214 and an active surface 216 as set forth herein. In one embodiment, the die 212 is from about 4 mils thick to about 50 mils thick.

Upon the active surface 216, the semiconductor die 212 includes a plurality of C4 solder connections 218 thereon similar to what is depicted in FIG. 3A. FIG. 4A also illustrates a plurality of electrical contact pads 222 thereon.

FIG. 4A also illustrates the presence of an underfill material 224. The underfill material 224 is introduced on a side of the semiconductor die 212 by a feed conduit (not pictured) and a gas outlet conduit (not pictured) that are similar to the embodiment depicted in FIG. 3A. A non-tacky film 230 is depicted in FIG. 4A as having been stretched over the flip-chip assembly 210 and a mold press 232 is depicted as rendering a cross-sectional profile to non-tacky film 230, and consequently to the underfill material 224. Of underfill material 224, it includes a fillet portion 234 and an interstitial portion 236 between the die 212 and the mounting substrate 220.

The method includes placing the non-tacky film 230 against the flip-chip assembly 210, and stretching it over the semiconductor die 212 and onto the mounting substrate 220. The form that the non-tacky film 230 takes is influenced by the shape of the mold press 232 that holds the non-tacky film 230 against the mounting substrate 220. After securely holding the non-tacky film 230 against the mounting substrate 220, underfilling of the die 212 is accomplished with the underfill material 224.

Figure 4B:
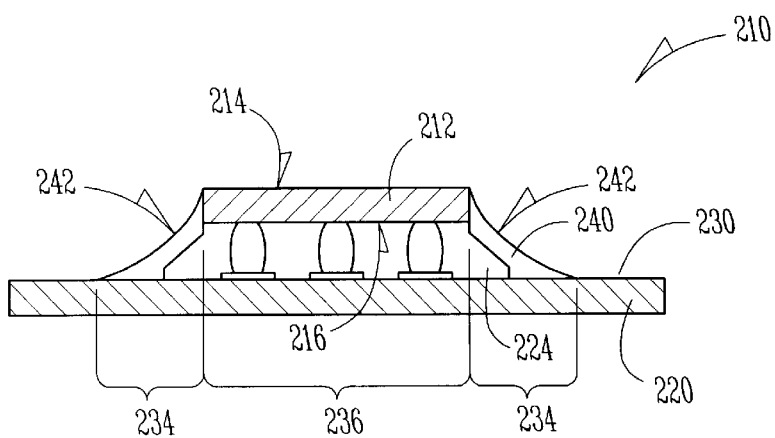
FIG. 4B is a cross section of the chip package depicted in FIG. 4A after further processing.

The mold press 232 has a heater element 238 (depicted schematically). In one embodiment, the heater element 238 acts to cure a portion of the underfill material 224 that is in contact with the non-tacky film 230. FIG. 4B depicts the flip-chip assembly 210 after the non-tacky film 230 has been removed, but before a completed cure of the underfill material 224 has been accomplished. A conductive heat transfer process has been carried out between the mold press 232 (FIG. 4A) by its heater element 238 (FIG. 4A), and the underfill material 224 is partially cured, gelled, and solidified.

After removing the mold press 232 (FIG. 4A) and the non-tacky film 230 (FIG. 4A), further processing is carried out to cure the bulk of the underfill material 224. Based on the underfill material and heating approach, there may or may not be a characteristic grain or solidification morphology 240 as depicted in FIG. 4B. In an embodiment, after removing the mold press 232 and the non-tacky film 230, curing the underfill material that is between the die and the mounting substrate is carried out by placing the package into a curing oven.

In another embodiment, the mold press 232 remains in place during the curing process. In one variant of this embodiment, the mold press 232 acts as the entire heat source for curing. In another variant of this embodiment, the mold press 232 is assisted in the curing process by another heat source such as a curing oven as set forth herein.

In any event, oven curing according to this embodiment entails a two-stage ramp-and-hold process, or a single-ramp process as set forth herein. Similar to the embodiment depicted in FIG. 3C, the embodiment depicted in FIG. 4B includes a cured underfill material 224, including the fillet portion 234, and an interstitial portion 224 between the die 212 and the mounting substrate 220. The concave curvilinear cross-sectional profile is caused by contraction of the underfill material 224 during the curing process according to an embodiment.

Various curing schemes may be used. In one embodiment, a two-stage heat curing scheme is used. According to this embodiment, the method accordingly proceeds to a time after beginning curing the bulk of the underfill material 224. This heating scheme includes a first temperature ramp to a temperature range from about 100° C. to about 180° C. Next, a temperature hold is maintained at a temperature in this range. The temperature hold may be from about 10 seconds to about 90 minutes. The first temperature hold achieves a cure of the bulk of the underfill material 224. Thereafter, a second temperature ramp is accomplished. The second temperature ramp is carried out to a temperature range from about 140° C. to about 260° C. After achieving a selected temperature in this range, it may be held from about 10 seconds to about 30 minutes. However, in one embodiment, no substantial hold time is required as the non-tacky film 230 may be removed at any time after the gelling of the underfill material 224. Thereafter, ambient cooling of the flip-chip assembly 210 may be done. As set forth herein, removal of the non-tacky film 230 may precede or follow the ambient cooling.

In another embodiment, a single ramp-ramp curing scheme is used. In this embodiment, a linear continuous curing oven is set to a selected temperature and flip-chip assembly 210 heats as it passes through the oven. In one embodiment, the single step temperature ramp is in a range from about 140° C. to about 240° C. Thereafter, ambient cooling of flip-chip assembly 210 may be done. As set forth herein, removal of the non-tacky film 230 may precede or follow the ambient cooling.

Figure 5:
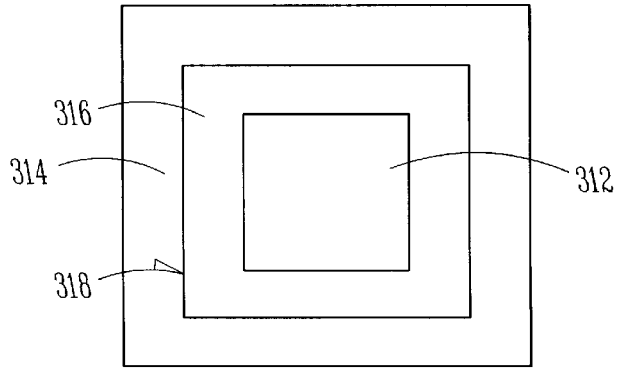
FIG. 5 is a top plan view of the chip package that is achieved according to an embodiment.

FIG. 5 illustrates a top plan view of an embodiment that is achievable by either of the processes depicted in FIGS. 3 and 4. A flip-chip assembly 310 includes a semiconductor die 312, a mounting substrate 314, and the fillet portion 316 of an underfill material. Unlike the prior art structures, it is noted that the fillet portion 316 is determined by the press mold an in most cases exhibits a symmetrical rectilinear footprint 318 on the mounting substrate 314. Further, the fillet portion 316 fillet portion includes a surface roughness and pattern that is characteristic of the imprint that an interstitial film surface roughness and pattern leaves according to the embodiments set forth herein.

Figure 6:
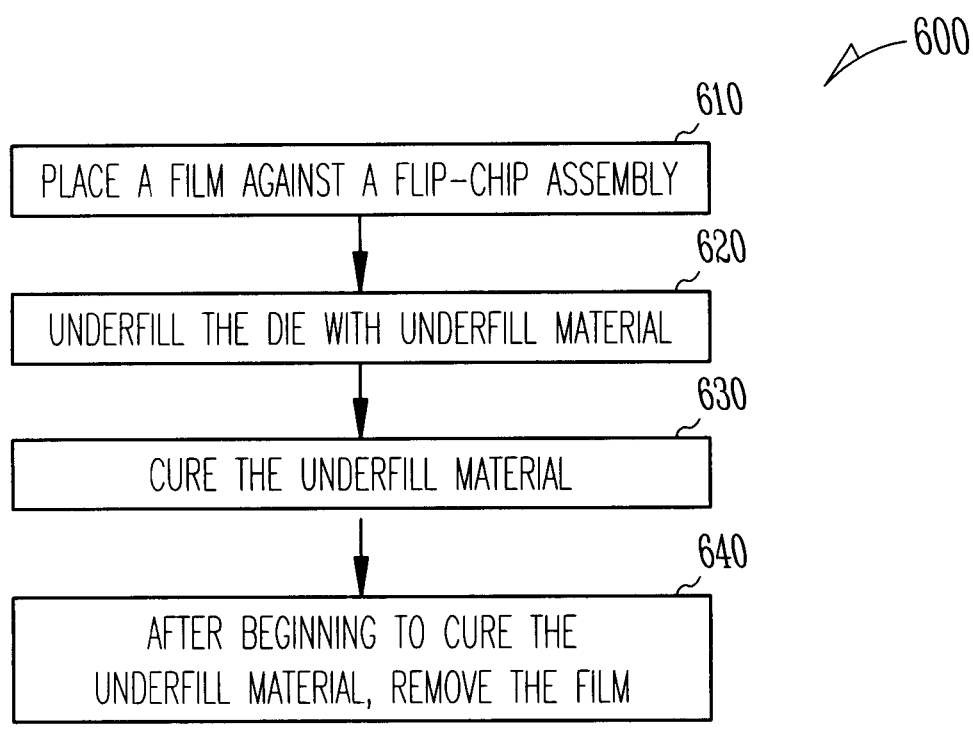
FIG. 6 is a process flow block diagram of the inventive process.

FIG. 6 illustrates a process flow embodiment 600. In a first process flow, a film is placed 610 against a flip-chip assembly. The film may be a tacky film or a non-tacky film as set forth herein. The flip-chip assembly includes a die, an electrical connection, and a mounting substrate. Next, the die is underfilled 620 with underfill material by any method set forth herein. Next, curing 630 of the underfill material is carried out, but at some time after beginning curing 630 the underfill material, the film is removed 640. Removal 640 may be done according to the sticky-film process embodiments or the non-sticky film embodiments as set forth herein.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A method of forming a package, comprising:
    placing a film against a flip-chip assembly, wherein the film includes a tacky film, wherein the flip-chip assembly includes a die, an electrical connection, and a mounting substrate;
    underfilling the die with underfill material;
    curing the underfill material; and
    after beginning curing the underfill material, removing the film.

2. The method according to claim 1, wherein after beginning curing the underfill material, curing includes:
    curing the underfill material that is in contact with the film;
    removing the film; and after removing the film
    curing the underfill material that is between the die and the mounting substrate.

3. The method according to claim 1, wherein the underfill material has a viscosity that causes it to draw between the die and the mounting substrate without the assistance of a pressure differential.

4. The method according to claim 1, wherein the underfill material has a viscosity that causes it to draw between the die and the mounting substrate, further including:
    flowing the underfill material from a first edge of the die to an opposite, second edge of the die by a pressure differential.

5. A method of forming a package, comprising:
    placing a film against a flip-chip assembly, wherein the film includes a tacky film, wherein the flip-chip assembly includes a die, an electrical connection, and a mounting substrate;
    underfilling the die with underfill material;
    curing the underfill material; and
    after beginning curing the underfill material, removing the film, and wherein curing the underfill material is carried out under heat that causes the tacky film to release from the flip-chip assembly.

6. A method of forming a package, comprising:
    placing a film against a flip-chip assembly, wherein the film includes a tacky film, wherein the flip-chip assembly includes a die, an electrical connection, and a mounting substrate;
    underfilling the die with underfill material;
    curing the underfill material; and
    after beginning curing the underfill material, removing the film, wherein after beginning curing the underfill material, curing includes:
        heating the package in a curing oven under conditions to cause the tacky film to release from the flip-chip assembly.

7. A method of forming a package, comprising:
    placing a film against a flip-chip assembly, wherein the film includes a tacky film, wherein the flip-chip assembly includes a die, an electrical connection, and a mounting substrate;
    underfilling the die with underfill material;
    curing the underfill material; and
    after beginning curing the underfill material, removing the film, wherein after beginning curing the underfill material, curing includes:
        heating the package in a curing oven under conditions to cause the tacky film to release from the flip-chip assembly, wherein heating includes a first temperature ramp to a temperature range from about 100° C. to about 180° C., a temperature hold at a temperature in this range, a second temperature ramp to a temperature range from about 140° C. to about 260° C., and cooling.

8. A method of forming a package, comprising:
    placing a film against a flip-chip assembly, wherein the flip-chip assembly includes a die, an electrical connection, and a mounting substrate;
    underfilling the die with underfill material;
    curing the underfill material; and
    after beginning curing the underfill material, removing the film wherein after beginning curing the underfill, curing includes:
        heating the package in a curing oven under conditions to cause the film to release from the flip-chip assembly, wherein heating includes a single step temperature ramp to a temperature in a range from about 140° C. to about 240° C.; and
        cooling.

9. A method of forming a package, comprising:
    stretching a flexible film over die that is mounted on a mounting substrate to seal the flexible film thereupon;
    flowing underfill material between the die and the mounting substrate with a source and a vent;
    heating the underfill material to a first curing temperature; and
    after reaching the first curing temperature, removing the flexible film.

10. The method according to claim 9, wherein the film is selected from a non-tacky film and a tacky film.

11. The method according to claim 9, wherein the film includes a tacky film, and wherein heating the underfill material to a first curing temperature is carried out to cause the underfill material to cure, and wherein the first curing temperature is reached to a temperature range from about 100° C. to about 180° C.; and
    wherein a second curing temperature causes the tacky film to release from the die and mounting substrate, and wherein the second curing temperature is reached to a temperature range from 140° C. to about 260° C.

12. The method according to claim 9, wherein the film is a non-tacky film and wherein after heating the underfill material to a first curing temperature, curing includes:
    gelling the underfill material that is in contact with the film;
    removing the film; and the process further including:
        curing the underfill material that is between the die and the mounting substrate.

13. The method according to claim 9, wherein heating the underfill material to a first curing temperature includes:
    heating along a first temperature ramp to a first temperature range from about 100° C. to about 180° C.; and further including:

holding the first temperature;

heating along a second ramp to a temperature range from about 140° C. to about 260° C.; and cooling.

14. The method according to claim 9, wherein the underfill material has a viscosity that causes it to draw between the die and the mounting substrate, further including:

flowing the underfill material from a first edge of the die to an opposite, second edge of the die by a pressure differential.

15. A method of forming a package, comprising:

placing a film against a flip-chip assembly, wherein the flip-chip assembly includes a die, an electrical connection, and a mounting substrate;

underfilling the die with underfill material;

curing the underfill material;

after beginning curing the underfill material, removing the film, wherein after beginning curing the underfill material and removing the film, curing includes:

curing the underfill material that is in contact with the film by conductive heat transfer from a mold press;

removing the film; and thereafter curing the underfill material that is between the die and the mounting substrate by placing the package into a curing oven.

16. The method according to claim 15, wherein the film includes a tacky film.

* * * * *

UNITED STATES PATENT AND TRADEMARK OFFICE
CERTIFICATE OF CORRECTION

PATENT NO. : 6,703,299 B2
DATED : March 9, 2004
INVENTOR(S) : Shi et al.

It is certified that error appears in the above-identified patent and that said Letters Patent is hereby corrected as shown below:

Title page,
Item [57], Abstract,
Line 7, after "non-tacky" delete "tacky".

Signed and Sealed this

Tenth Day of August, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,703,299 B2  
DATED : March 9, 2004  
INVENTOR(S) : Shi et al.

Page 1 of 1

It is certified that error appears in the above-identified patent and that said Letters Patent is hereby corrected as shown below:

<u>Title Page,</u>  
Item [57], ABSTRACT,  
Line 7, after "non-tacky" delete "tacky".

Signed and Sealed this

Eighteenth Day of April, 2006

JON W. DUDAS  
*Director of the United States Patent and Trademark Office*